(12) United States Patent
Conta et al.

(10) Patent No.: US 8,710,921 B2
(45) Date of Patent: Apr. 29, 2014

(54) HIGH ORDER CONTINUOUS TIME FILTER

(75) Inventors: Matteo Conta, Irvine, CA (US); Andrea Baschirotto, Tortona (IT); Stefano D'Amico, Corsano (IT)

(73) Assignee: ST-Ericsson SA, Plan-les-Ouates (CH)

( * ) Notice: Subject to any disclaimer, the term of this patent is extended or adjusted under 35 U.S.C. 154(b) by 785 days.

(21) Appl. No.: 12/204,533

(22) Filed: Sep. 4, 2008

(65) Prior Publication Data

US 2009/0237153 A1    Sep. 24, 2009

(30) Foreign Application Priority Data

Mar. 21, 2008   (WO) .................. PCT/IT2008/000188

(51) Int. Cl.
*H03B 1/00*   (2006.01)
*H03H 11/04*   (2006.01)

(52) U.S. Cl.
CPC ..................................... *H03H 11/04* (2013.01)
USPC ........................................................ 327/558

(58) Field of Classification Search
USPC .............. 327/558, 31, 34, 309, 551, 552, 553
See application file for complete search history.

(56) References Cited

U.S. PATENT DOCUMENTS

| | | | |
|---|---|---|---|
| 5,410,745 A * | 4/1995 | Friesen et al. | 455/341 |
| 5,525,930 A * | 6/1996 | Pothast et al. | 330/252 |
| 5,600,287 A * | 2/1997 | Kwan et al. | 333/195 |
| 6,084,470 A | 7/2000 | Shiramatsu et al. | |
| 6,359,503 B1 * | 3/2002 | Alini et al. | 327/552 |

FOREIGN PATENT DOCUMENTS

| | | |
|---|---|---|
| JP | 2000077975 | 3/2000 |
| WO | 2007/034222 | 3/2007 |

OTHER PUBLICATIONS

S. D'Amico, M. De Matteis, A. Baschirotto, "A 6th-Order 100 μA 280MHz Source-Follower-Based Single-loop Continuous-Time Filter", Feb. 4, 2008, Digest of Technical Papers, ISSCC 2008, pp. 72,73.*
International Search Report and Written Opinion of the International Searching Authority, PCT/IT2008/000188. Dec. 4, 2008.
D'Amico, S., et al., "A 6th Order 100 A 280 MHz Source-Follower-Based Single-loop Continuous-Time Filter," Solid-State Circuits Conference, 2008, pp. 72-73 and p. 596, Feb. 3, 2008.
Conta, et al., "A 4.1 mw 10 MHz Fourth Order Source Follower Based Continuous Time Filter with 79 Decibels DR", IEEE Journal of Solid State Circuits, vol. 41, No. 12, Dec. 2006, pp. 2713-2719.

* cited by examiner

Primary Examiner — Sibin Chen
(74) Attorney, Agent, or Firm — Coats & Bennett, P.L.L.C.

(57) ABSTRACT

There is described a continuous time filter of at least a second (or higher) order, comprising one or more first order filter stages of a first type, the or each first order filter stage of the first type comprising a reactive component and an impedance dependent on the difference between the input and output voltages of the filter stage. The filter includes at least one first order filter stage of a second type, the or each second order filter of the second type comprising a reactive component and an impedance dependent on the sum of the input and output voltages of the filter stage. The filter includes a transfer function of the continuous time filter that is obtained comprising complex poles.

14 Claims, 11 Drawing Sheets

HIGH ORDER CONTINUOUS TIME FILTER

CROSS REFERENCE TO RELATED APPLICATIONS

The present application claims priority under 35 U.S.C. §119 (a)-(d) to Application No. PCT/IT2008/000188, filed on Mar. 21, 2008, the entire contents of which are incorporated herein by reference.

FIELD OF THE INVENTION

The present invention relates to a high (second or more) order continuous time filter, and more particularly to such a filter provided with a transfer function having complex poles without requiring overall feedback.

BACKGROUND TO THE INVENTION

Electric filters are well known in the art and various different configurations are known which provide different frequency responses. Typically, an electric filter can be categorized as any of a low pass (by which low frequency signals are passed), high pass (by which high frequency signals are passed), band pass (by which only signals within a certain frequency band are passed), or band stop (by which only signal frequencies outside a particular band are passed). Moreover, within these classifications various other classifications can be made dependent upon the precise filter response, for example Butterworth, Chebyshev, Bessel, or the like. Such filters are well known in the art.

Such filters may be passive filters, by which is meant that the components have no amplifying/active (either voltage or current) elements therein, or active filters, which usually comprise one or more transistors provided with a power supply to act as an active element. Various different transistor circuits are well known in the art, one of which is the source follower circuit (known as an emitter follower, or common collector, when using bipolar junction transistors). The source follower is a well-known basic building block for micro electronics designs, and exhibits excellent linearity even with lower overdrive voltages ($V_{ov}=V_{gs}-V_{th}$). Due to this linearity it has been proposed previously that the source follower circuit can be the basis of a high linearity and low power analogue filter.

Figure 1:
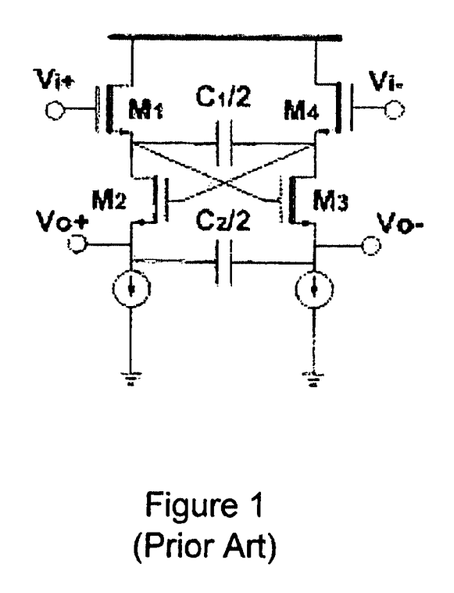
FIG. 1 is a circuit diagram of a second order bi-quadratic cell of the prior art.

More particularly, in D'Amico et al. "A 4.1 mw 10 MHz Fourth Order Source Follower Based Continuous Time Filter with 79. Decibels DR", *IEEE Journal of Solid State Circuits*, Volume 41, no. 12, December 2006, there is described a source follower based second order filter based upon a "bi-quadratic cell" architecture. The bi-quadratic cell second order filter disclosed in this document is shown in FIG. 1. Additionally, the same circuit is also described and claimed in WO 2007/034222, which is a prior published International patent application belonging to the present assignee.

The bi-quadratic cell structure shown in FIG. 1 is a pseudo differential structure using a source follower loaded by a positive feedback network. The key element of the bi-quadratic cell is the positive feedback in MOS devices M2 and M3, which allows the synthesis of two complex poles. The arrangement provides significant advantages, such as having extremely good linearity which is achieved for a low overdrive voltage. Additionally, the circuit has low power consumption for a given pole frequency, and a low output impedance is achieved, with no common mode feedback being required. As mentioned, the positive feedback provides for complex poles to be synthesised.

Figure 2:
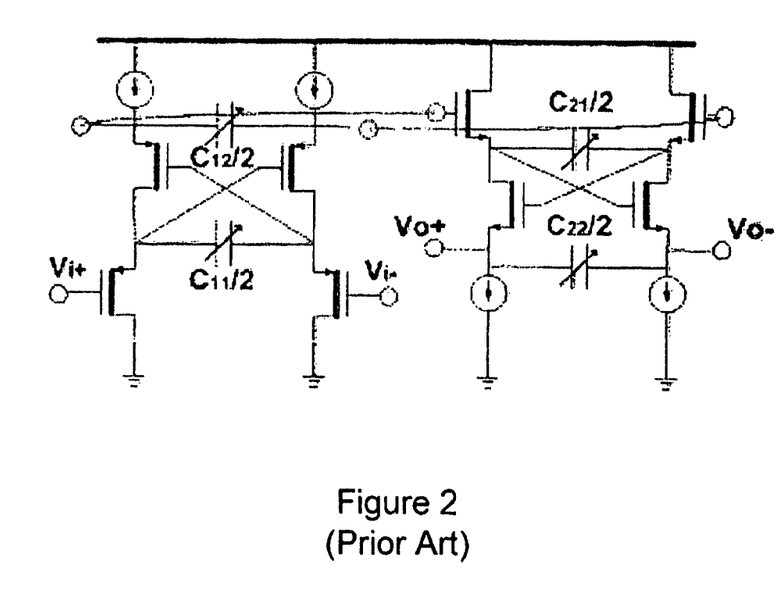
FIG. 2 is a circuit diagram of a fourth order filter of the prior art, comprising two bi-quadratic cells in cascade.

The bi-quadratic cell noted in FIG. 1, and as disclosed in WO 2007/034222 represents a single second order filter. To achieve higher order filters using the prior art bi-quadratic cell, D'Amico et al. proposes cascading multiple cells of the second order, to provide higher, even order, filters. FIG. 2, which corresponds to FIG. 6 of the IEEE Journal of Solid State Circuits article referenced previously, represents a fourth order filter, produced by cascading the output of a first bi-quadratic cell of FIG. 1, with an input of a second bi-quadratic cell. It should be noted, that in FIG. 2 the transistors of the bi-quadratic cell on the left hand side of the figure, i.e., the input cell are PMOS transistors, whereas the transistors of the second, cascaded bi-quadratic cell are NMOS transistors. It should be noted that in the fourth order filter of FIG. 2, which comprises two second order bi-quadratic cells, a total of four transistors are present in each second order cell, being the source follower transistors at the inputs, loaded with the positive feedback network devices ($M_2$ and $M_3$ in FIG. 1). Thus, to achieve the fourth order filter of FIG. 2, a total of eight transistor devices are required.

However, the cascaded arrangement of FIG. 2, while providing a higher order source follower based filter, and hence incorporating the advantages of the source follower arrangement, has two principle drawbacks. Firstly, because the filter essentially comprises two second-order bi-quadratic cells, the transistor component count is relatively high, as essentially each second order cell requires an input stage, as well as the feedback network.

Additionally, the cascaded arrangement is sensitive to component variation, and in particular, when the arrangement is implemented as an integrated circuit. This means that small changes in component characteristics impacts negatively on filter performance in that either the desired transfer function may not be obtained, or the linearity or low power characteristics are not maintained (mainly the transfer function accuracy would be affected). These drawbacks of the cascading bi-quadratic cell structure therefore mean that while it is suitable for use in some applications, it would be preferable if the frequency response accuracy sensitivity could be improved, such that the filter response is rendered more robust to component variations. However, the advantages that it provides which follow from the use of the source follower are particularly desirable, and hence, it would be advantageous if such advantages could be obtained in a structure which does not possess the disadvantage of high sensitivity to component variation.

SUMMARY OF THE INVENTION

Embodiments of the present invention address the above problems by providing a continuous time filter of a second or higher order which provides the advantages of the source follower arrangements of the prior art, but avoids the disadvantages of the separate cascaded bi-quadratic cells. In particular, embodiments of the invention provide for an intrinsic higher robustness in terms of transfer function sensitivity with respect to component variations, and in particular embodiments of the invention provide a succession of individual first order filter stages, which are connected together in a ladder structure, rather than in cascade. Additionally, at least one of the first order filter stages incorporates an impedance that is dependent on the sum of the input and output voltages to the stage, rather than the difference between the input and the output voltages. The inclusion of such a novel impedance means that when connected to an at least one other first order filter an at least second order transfer function with complex poles results. In preferred embodiments, the first order stages are implemented as respective source follower circuits. Where the first order source follower circuit is to include an impedance which is dependent on the sum of the input and output voltages, then this is provided as a pair of cross connected transistors, wherein for N-channel devices the drain (collector) is connected to the gate (base) of the opposite transistor. Such a cross connection gives the impedance which is dependent on the sum of the input and output voltages.

In view of the above, from a first aspect there is provided a continuous time filter of at least a second (or higher) order, comprising: one or more first order filter stages of a first type, the or each first order filter stage of the first type comprising a reactive component and an impedance dependent on the difference between the input and output voltages of the filter stage; at least one first order filter stage of a second type, the or each second order filter of the second type comprising a reactive component and an impedance dependent on the sum of the input and output voltages of the filter stage; wherein a transfer function of the continuous time filter is obtained comprising complex poles.

With the invention, therefore a stable higher order filter can be provided with a relatively simple structure, and which allows for lower power consumption than has heretofore been the case.

Preferably there is a plurality of filter stages of the first type and of the second type, wherein the number of filter stages of both the first and second types is indicative of the order of the filter. Thus, higher order filters can be easily obtained simply by adding as many filter stages as are required More preferably, to obtain an even order filter of order n, there are n/2 filter stages of each of the first type and of the second type, whereas to obtain an odd ordered filter, there are (n−1)/2 filter stages of one of the first type or the second type, and (n+1)/2 filters stages of the other of the first type or the second type. Thus, the number of filter stages of the first and second types is maintained approximately the same, which has been found to be advantageous.

Preferably the filter stages of the first type and the second type also alternate in series, such that, for all stages other than a last stage, the output of a filter stage of one of the first or second types is connected to the input of a filter stage of the other of the first type or the second type. Such an arrangement has been found to be particularly preferable.

Furthermore, preferably the filter stage of the first type comprises a pair of transistors arranged to provide a differential input and output, the impedance of the filter stage of the first type being realized by arranging the transistors in self-diode connection. Additionally, preferably the filter stage of the second type comprises a pair of transistors arranged to provide a differential input and output, the impedance of the filter stage of the second type being realized by arranging the transistors in cross-diode connection. With such an arrangement the advantages noted previously of the use of a source follower can be obtained.

In particularly preferred embodiments, the transistors are MOSFETs, and preferably fabricated as integrated circuits using CMOS technology. This provides significant manufacturing and implementation advantages, as a single MOSFET can act as a transconductor, thus reducing component count.

In the preferred embodiments using N-channel devices, the self-diode connection is provided by connecting the drain to the gate of each respective transistor in the filter stage of the first type, and the cross-diode connection is provided by connecting the drain of one of the pair of transistors to the gate of the other transistor of the pair, and vice versa.

For P-channel devices the self-diode connection is provided by connecting the drain to the gate of each respective transistor in the filter stage of the first type, and the cross-diode connection is provided by connecting the drain of one of the pair of transistors to the gate of the other transistor of the pair, and vice versa.

Moreover, in preferred embodiment sequential filter stages alternate between comprising n-channel or p-channel transistors. This has advantages in that the DC level may be substantially maintained.

Where a high input impedance must be guaranteed, an ideal source-follower input stage, comprising a pair of transistors arranged to provide a differential input and output, and further comprising at least one reactive component, can be provided as an input stage to the filter. Even more preferably, the ideal source follower input stage comprises one of n-channel or p-channel transistors, and wherein the next stage in the filter comprises transistors of the opposite type. This maintains the DC level between the input and the output.

From another aspect, the invention also provides a second order continuous time filter comprising: a first stage having at least one diode connected transistor and at least one reactive component, and a second stage having at least a pair of transistors having the gates (or bases) of each connected to the drains (or collectors) of the other and at least one reactive component, the filter having a transfer function which provides for the synthesis of complex poles without the need for feedback from the output of the filter to the input of the first-stage. Thus, a second order filter having low power consumption and reduced component count can be obtained.

BRIEF DESCRIPTION OF THE DRAWINGS

Further features and advantages of the present invention will become apparent from the following description of embodiments thereof, presented by way of example only, and wherein like reference numerals refer to like parts, and wherein.

DETAILED DESCRIPTION OF THE PREFERRED EMBODIMENTS OF THE INVENTION

Various embodiments of the present invention will now be described.

Figure 3:
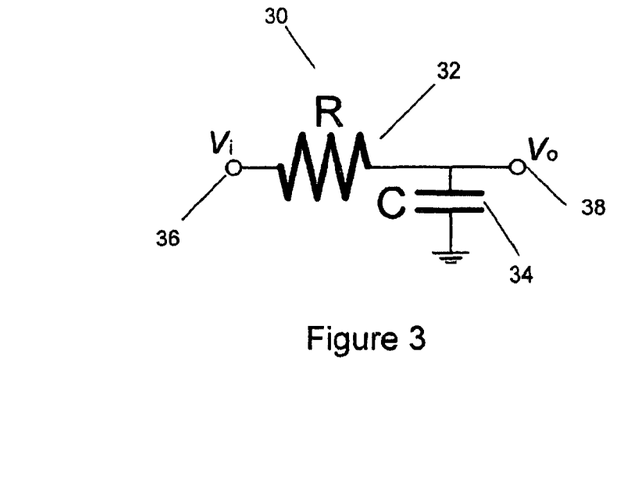
FIG. 3 is a circuit diagram of a first order filter, which is used as a component in embodiments of the present invention.
Figure 4:
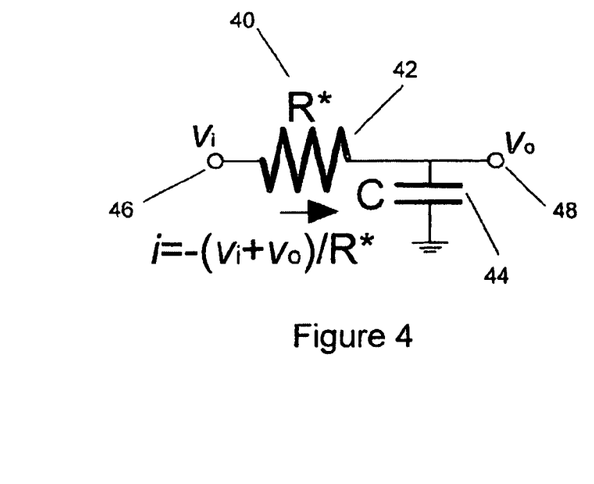
FIG. 4 is a circuit diagram of a second first order filter, which is also used in embodiments of the present invention.

The embodiments of the invention relate to second or higher order continuous time filters, each of which are based on combining two or more first order building blocks, respectively, shown in FIGS. 3 and 4. A first first order building block is shown in FIG. 3, and we shall refer to this as a "positive" first order cell.

More particularly, the positive first order cell 30 of FIG. 3 comprises an input node 36, and an output node 38. Connected between the input and output node is a resistor 32 of impedance R. Connected between the output node and ground is a capacitor 34, of capacitance C The arrangement therefore comprises a first order low pass filter, and as described so far is conventional.

FIG. 4 illustrates a second first order filter building block, which we will refer to as a "negative" first order cell 40. The negative cell comprises an input 46 and output 48, and an impedance 42 of value R* connected there between. Between the output node 48 and the ground is a capacitor 44 of capacitance C.

The impedance R* is characterised by the following relationship between the voltage at its nodes and the current flowing:

$$i = -\frac{v_i + v_o}{R^*}$$

Notice that this impedance is not standard. The impedance is dependent on the sum of the input and output voltages, rather than the difference: several implementations of this circuit will be described later. Such an impedance is useful, as will become apparent from the following, because when such a negative cell is connected together with a positive cell, a second order filter is obtained which has complex poles. It is therefore possible, using such an impedance, to synthesize complex poles without having overall feedback (although as shown later, an internal feedback is needed to synthesize an embodiment of this cell). Thus, the filter will be stable, but will also possess the advantages of being relatively low power, an important consideration for mobile applications.

Figure 5:
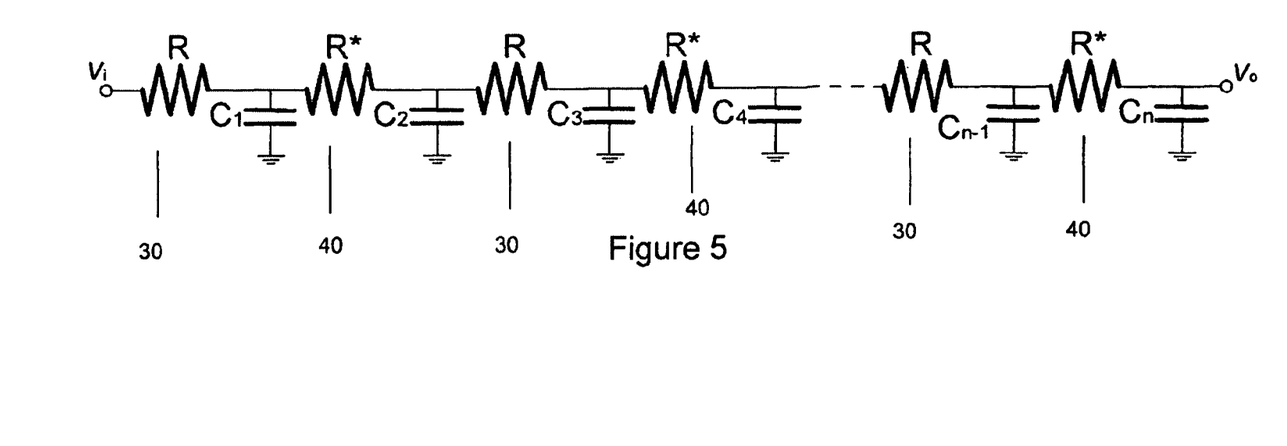
FIG. 5 is a circuit diagram of an nth order filter, which makes use of the first order filter circuits of FIGS. 3 and 4, and constitutes a first embodiment of the present invention.
Figure 6:
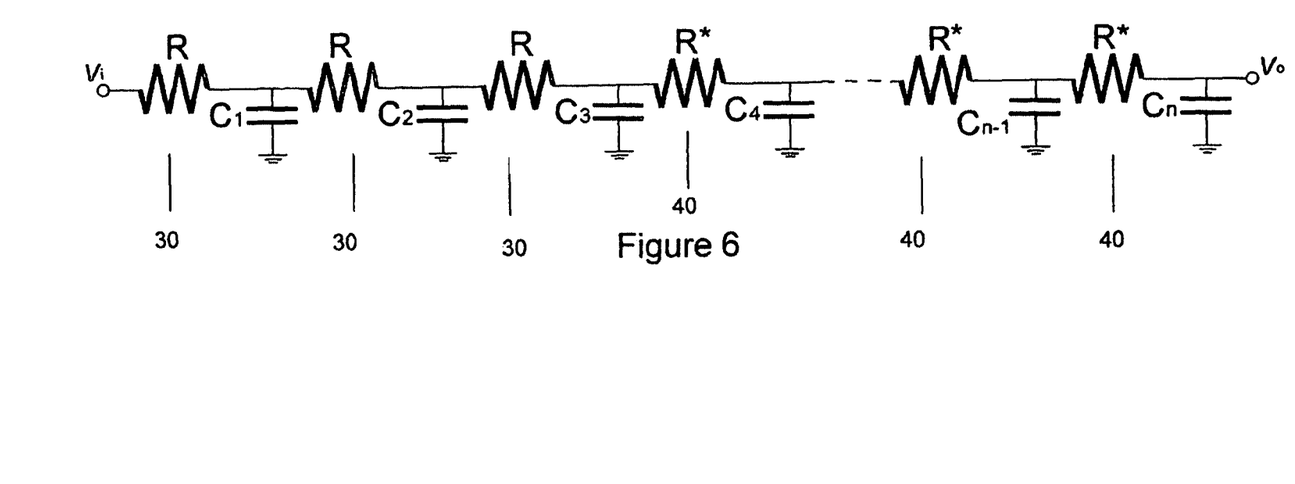
FIG. 6 is a circuit diagram of an nth order filter according to a second embodiment of the present invention.
Figure 7:
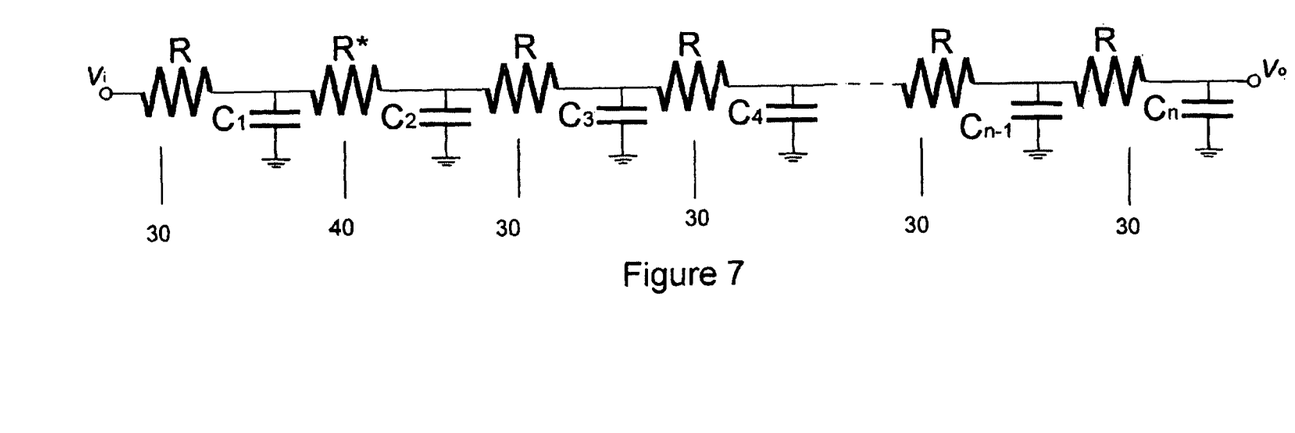
FIG. 7 is a circuit diagram of an nth order filter according to a third embodiment of the present invention.

Second (or higher) order filters are composed by composing a sequence of the positive and negative cells, as shown in FIGS. 5 to 7. More particularly, as shown in FIG. 5 an nth order filter provided by arranging n/2 positive cells 30 in series with n/2 negative cells 40. As shown in FIG. 5, preferably the positive and negative cells are alternated, and this provides what the inventors consider to be the best result. However, it is not necessary to alternate the positive and negative cells, and as shown in FIG. 6, the nth order filter may comprise a plurality of positive cells in series, followed by a plurality of negative cells.

In other embodiments, it is not even necessary to have the same number of positive and negative cells. As shown in FIG. 7 only one negative cell 40 is included, with the remainder of the cells being positive cells. However, it is necessary to include at least one negative cell, because it is the negative impedance R* which allows the synthesis of complex poles in the filter transfer function, without the requirement for feedback.

In other embodiments, even less ordered sequences of positive and negative cells may be used, and positive and negative cells may be placed in series in any order and in any number up to the desired order of the filter. The only requirement, however, is that at least one negative cell is included, for the reasons mentioned above.

Figure 8:
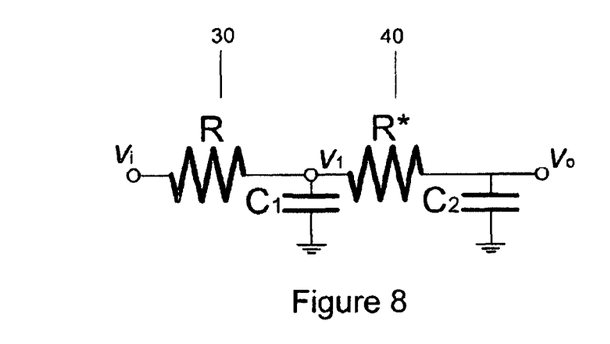
FIG. 8 is a circuit diagram of a second order filter used to illustrate a transfer function for a second order filter of the present invention.

Concerning the transfer function of such a filter, FIG. 8 shows an example second order filter, comprising a single positive cell 30, and a single negative cell 40 connected in series, with the input of the negative cell 40 connected to the output of the positive cell 30. With such an arrangement, the equations for the transfer function evaluation are as follows:

$$\begin{cases} \frac{v_i - v_1}{R} = s \cdot C_1 \cdot v_1 + \left[-\frac{v_1 + v_o}{R^*}\right] \\ \left[-\frac{v_1 + v_o}{R^*}\right] = s \cdot C_2 \cdot v_o \end{cases}$$

Assuming R=R*, the transfer function is evaluated as:

$$H(s) = \frac{v_o}{v_i} = \frac{1}{s^2 \cdot C_1 \cdot C_2 \cdot R^2 + s \cdot C_1 \cdot R + 1},$$

i.e., complex poles result.

As mentioned above, the positive and negative cells are, in preferred embodiments, implemented using CMOS (complementary metal oxide silicon) technology. More particularly, in the circuit implementations described below the positive and negative cells are implemented using source follower stages, such that the advantages of the source follower described previously with respect to the prior art are obtained.

Figure 9:
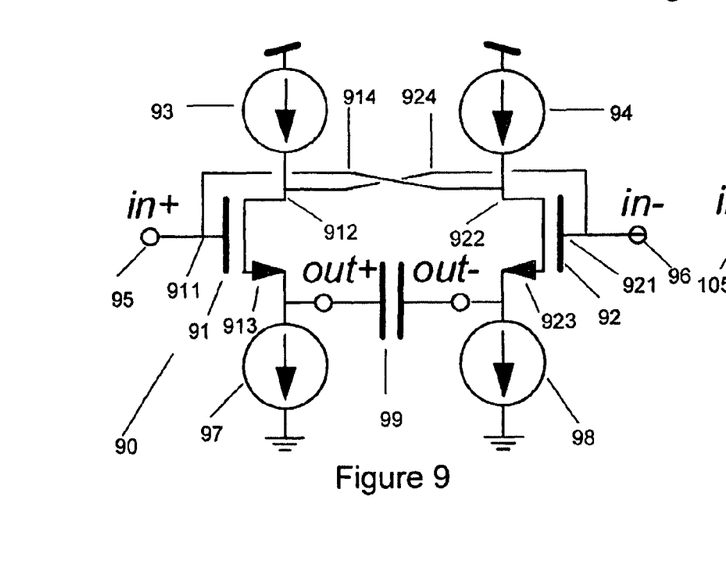
FIG. 9 is a circuit diagram of an NMOS type source follower circuit, implementing the circuit of FIG. 3 in a further embodiment of the present invention.

FIG. 9 is a circuit diagram of an NMOS negative source follower cell 90. The cell is a differential cell comprising two NMOS field effect transistors 91 and 92, arranged in a differential structure.

More particularly, the NMOS negative source follower cell 90 comprises a first MOSFET 91, and a second MOSFET 92. A positive input 95 is provided at the gate 911 of the first MOSFET 91, and a negative input is provided at the gate 921 of the second MOSFET 92. A first current source 93 is connected between the power rails and the drain 912 of the first MOSFET 91, whereas a second current source 94 is connected between the power rails and the drain 922 of the second MOSFET 92. Similarly, a third current source 97 is connected between the source 913 of the first MOSFET 91, and the ground rail, whereas a fourth current source 98 is connected between the source 923 of the second MOSFET 92, and the ground rail. Respective positive and negative output nodes are provided at respective sources 913 and 923 of the MOSFETs 91 and 92, and a capacitor 99, of value $C_1$, is connected therebetween. Further, the drain 912 of the first MOSFET 91 is connected (924) to the gate 921 of the second MOSFET 92, and the drain 922 of the second MOSFET 92 is connected (914) to the gate 911 of the first MOSFET 91.

In order to simulate the negative impedance R*, the two transistors 91 and 92 are cross connected, such that gate 911 of the first MOSFET 91 is connected to the drain 922 of the second MOSFET 92. Similarly, the gate 921 of the second MOSFET 92 is connected to the drain 912 of the first MOSFET 91. In this way, the impedance presented by the cross connected transistors is dependent on the sum of the input and output voltages i.e., the impedance R* can be provided.

Figure 10:
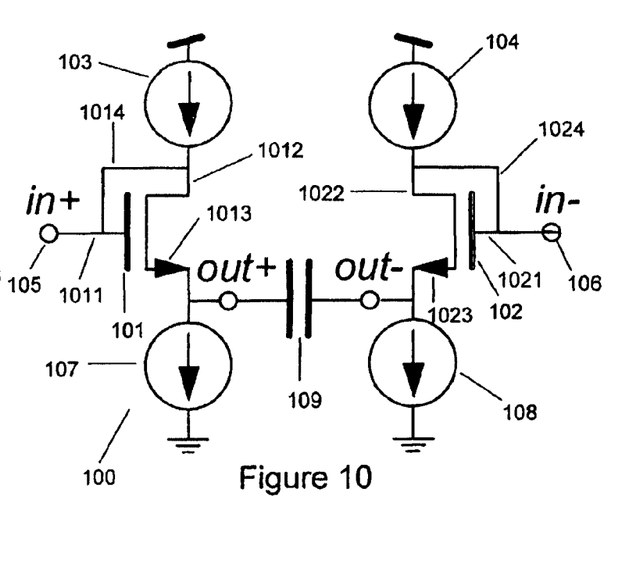
FIG. 10 is a circuit diagram of an NMOS type source follower circuit implementing the circuit of FIG. 4 in an embodiment of the present invention.

FIG. 10 shows an NMOS implementation of a positive source follower cell. Here, the NMOS positive source follower cell 100 comprises a first NMOS transistor, being MOSFET 101, and a second NMOS transistor, being MOSFET 102. A first current source 103 is connected between the power rail and the drain 1012 of the first MOSFET 101, whereas a second current source 104 is connected between the power rail and the drain 1022 of the second MOSFET 102. Similarly, a third current source 107 is connected between the source 1013 of the first MOSFET 101 and the ground rail, and a second current source 108 is connected between the source 1023 of the second MOSFET 102, and the ground rail. Respective outputs are provided from the respective sources 1013 and 1023 of the MOSFETs 101 and 102, and a capacitor of value $C_2$ is connected there between. Respective positive and negative inputs 105 and 106 are provided respectively at the gate 1011 of MOSFET 101, and gate 1021 of MOSFET 102. In order to provide the positive impedance R, the MOSFETs 101 and 102 are diode connected via connections 1014 and 1024, which connect the drains and gates of each transistor together. That is, drain 1012 and gate 1011 of MOSFET 101 are connected via connection 104, whereas drain 1022 and gate 1021 of MOSFET 102 are connected via connection 1024. The diode connection of the transistors provides the positive impedance required by the positive source-follower cell.

Both the positive and negative source follower cells of FIGS. 9 and 10 can operate with the following minimum supply voltage $V_{min}$:

$$V_{min} = 3V_{ov} + V_{th} + V_{swing},$$

where $V_{ov}$ is the transistor's overdrive, $V_{th}$ is the threshold voltage, while $V_{swing}$ is the signal swing. Additionally, the filter break frequency of each cell is provided by suitable selection of the value of capacitors C.

These cells also feature the main characteristics of being as linear as a source follower. This also implies that, as with the source follower, a larger linearity is achieved with a lower overdrive voltage. This is the opposite of other continuous time filter implementations. Having the same linearity for lower overdrive provides for lower power consumption.

In addition, using a source follower, these cells exhibit the same advantages as the bi-quadratic cell of the prior art, and in particular:

1) No parasitic poles are introduced, thereby avoiding the power cost of pushing non-dominant singularities at high frequency;

2) No common mode feedback circuit is used (the output common mode voltage is fixed by the transistors $V_{gs}$); and 3) A low output resistance is obtained for an even filter order. In fact, in this case, the series of a same number of positive and negative resistances results in a null equivalent resistance. As a source follower, the filter can drive a moderate of resistive load or a switch capacitor without substantially modifying the filter linearity and transfer function.

Each of positive and negative source follower cells of FIGS. 9 and 10 represents a first order filter stage. Therefore, in order to provide a second or higher order filter stage multiple source follower cells of FIGS. 9 and 10 are arranged in series, with the respective output of an earlier stage connected to the input of the next stage. A second order filter is obtained by connecting one positive and one negative source follower cell together, although higher order filters can be obtained by adding more positive or negative cells. The same criteria as was described previously with respect to FIGS. 5 to 7 applies, in that at least one negative source follower filter must be in the ladder of first order filters. Preferably, for an even order filter, as many negative source follower cells are included as positive source follower cells, and more preferably, the positive and negative cells are alternated.

Figure 11:
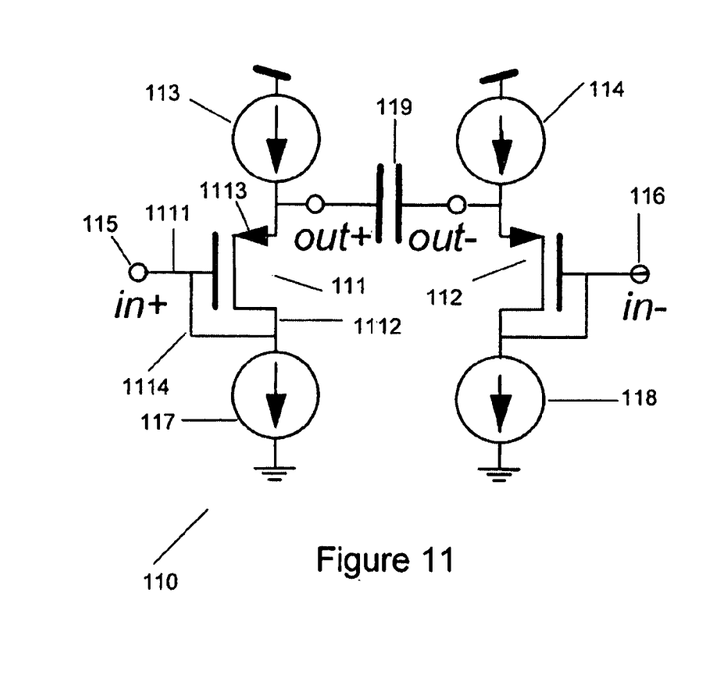
FIG. 11 is a circuit diagram of a PMOS type source follower circuit implementing the circuit of FIG. 3 in an embodiment of the present invention.
Figure 12:
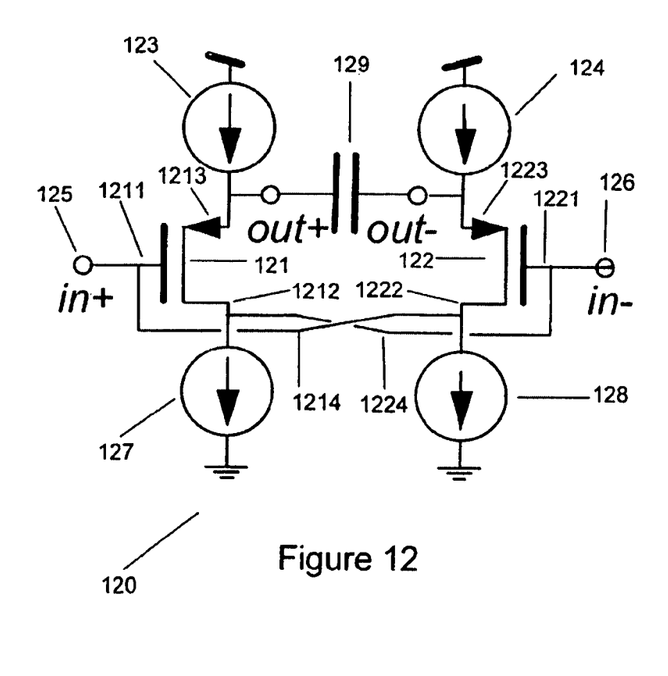
FIG. 12 is a circuit diagram of a PMOS type source follower circuit implementing the first order filter of FIG. 4 in an embodiment of the present invention.

However, cascading multiple NMOS positive and negative cells has a drawback relating to the voltage drop from the input of the filter to the output. This drawback can be solved by alternating an NMOS stage with a PMOS stage. FIGS. 11 and 12 show the equivalent PMOS implementations, with FIG. 11 corresponding to a PMOS positive source follower cell 110, and FIG. 12 corresponding to a PMOS negative source follower cell 120.

More particularly, the PMOS positive source follower cell 110 comprises two PMOS MOSFETs 111 and 112, which are diode connected, as shown. A positive input 115 is provided at the gate 1111 of MOSFET 111, whereas a negative input 116 is provided at the gate of MOSFET 112. Positive and negative output nodes are provided at source terminals of the transistors, connected by capacitor 119, as shown. As with the NMOS implementations, current sources 113, 114, 117, and 118 are provided. In particular, current source 113 is connected in series with MOSFET 111, and current source 117, between the supply rail, and the ground. Current source 114 is connected in series with MOSFET 112, and current source 118, between the supply rail and the ground.

FIG. 12 shows the PMOS implementation of a negative source follower cell. The PMOS negative source follower cell 120 comprises PMOS MOSFET transistors 121 and 122 which are cross connected in a similar manner as with the NMOS implementation, with the drain of one transistor connected to the gate of the other transistor. A positive input 125 is provided at the gate of transistor 121, whereas a negative input is provided at the gate of transistor 122. A positive output is provided at the source terminal 1213 of transistor 121, whereas a negative output is provided at the source terminal 1223 of transistor 122. A capacitor 129 is connected between the positive and negative output terminals. As with the NMOS negative source follower cell, current sources 123, 124, 127, and 128, are provided connected between the power rail and the respective source terminals of the transistors 121 and 122, and between the drain terminals 1212, and 1222 and the ground node.

In further embodiments, therefore, preferably an NMOS stage is alternated with a PMOS stage. That is, an NMOS positive or negative source follower stage is alternated with a PMOS positive or negative source follower stage. Whether a stage is a positive or negative stage follows the same criteria as discussed previously i.e. at least one of the stages must be a negative stage, but preferably there are as many negative stages as there are positive stages (for an even order filter), and more preferably, for either an even or an odd ordered filter the positive and negative stages are alternated. The alternation of positive and negative stages, and in particular where each alternative stage is alternately a PMOS or NMOS stage allows for the restoration of the DC level, which is downshifted and then up-shifted by $V_{gs}$ each time, by the positive and negative impedances respectively. Hence, the DC level is maintained, and the previous drawback noted above of a voltage drop between the input and the output is negated.

One particular point to note regards the input impedance, i.e., of the first stage. As mentioned, an overall filter of whatever order (two or more) that is required can be built up with the cells presented above. Using this approach, the input impedance depends on the filter order and on the input frequency. At low frequency the input impedance is equal to R for an even order structure, while it is equal to infinity (ideally) for an odd ordered structure. On the other hand, at high frequency, for any filter order the input impedance is equal to R.

Figure 13:
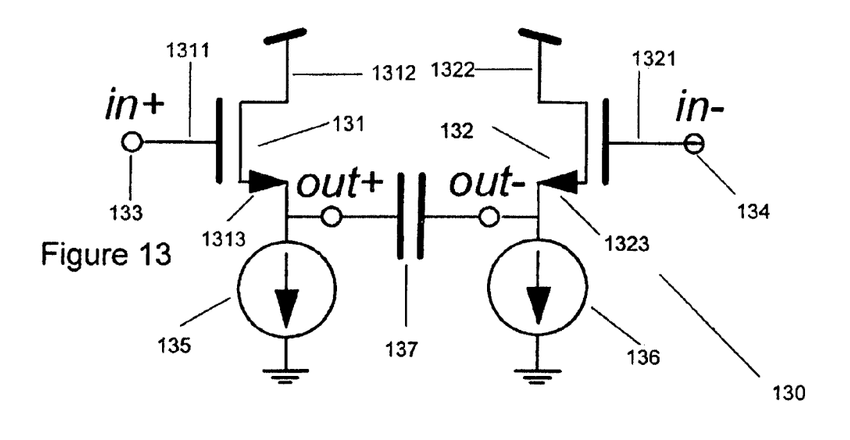
FIG. 13 is a circuit diagram of an NMOS input stage, which may be used in an embodiment of the present invention.
Figure 14:
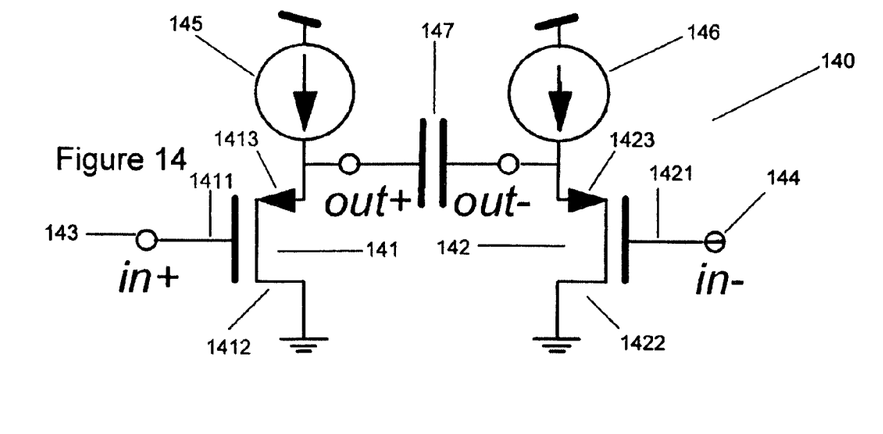
FIG. 14 is a circuit diagram of a PMOS input stage, which may be used in an embodiment of the present invention.

If the impedance level is critical for the particular filter under development, then just the first cell can be replaced by an ideal source follower circuit, i.e., one in which either the diode connections or the cross connections are not used. FIG. 13 is a circuit diagram illustrating a first order ideal NMOS source follower input cell 130, whereas FIG. 14 illustrates a PMOS first order ideal source follower input cell 140. In FIG. 13, the NMOS source follower input cell 130 comprises a pair of NMOS transistors 131 and 132 connected in a differential structure. A positive input 133 is provided at the gate 1311 of transistor 131, whereas a negative input 134 is provided at the gate 1321 of transistor 132. The respective drain terminals 1312 and 1322 of transistors 131 and 132 are connected to the power rail. A positive output is provided at the source terminal 1313 of transistor 131, whereas a negative output is provided at the source terminal 1323 of transistor 132. A capacitor 137 is connected between the positive and negative outputs. Each of the source terminals of the transistors are connected to ground via a respective current source 135 and 136.

FIG. 14 illustrates the PMOS source follower input cell 140. Here, PMOS transistors 141 and 142 are provided. The gate terminals 1411 and 1421 of the transistors 141 and 142 respectively provide a positive input terminal 143 (at gate 1411), and negative input terminal 144 (at gate 1421). The drain terminals 1412 and 1422 of each transistor are connected to ground, whereas the source terminals 1413 and 1423 provide positive and negative output terminals respectively, between which is connected a capacitor 147. A current source 145 is connected between the power rail and the source terminal 1413 of transistor 141, whereas a current source 146 is connected between the power rail and the source terminal 1423 of transistor 142.

Where either of the NMOS or PMOS source follower input stages are used, the input impedance is then given by the source follower input impedance, which is typically quite large.

As mentioned previously, in embodiments of the invention where the input impedance is, and should be quite large, then either of the NMOS or PMOS source follower input cells can be substituted for the first stage of the filter.

Figure 15:
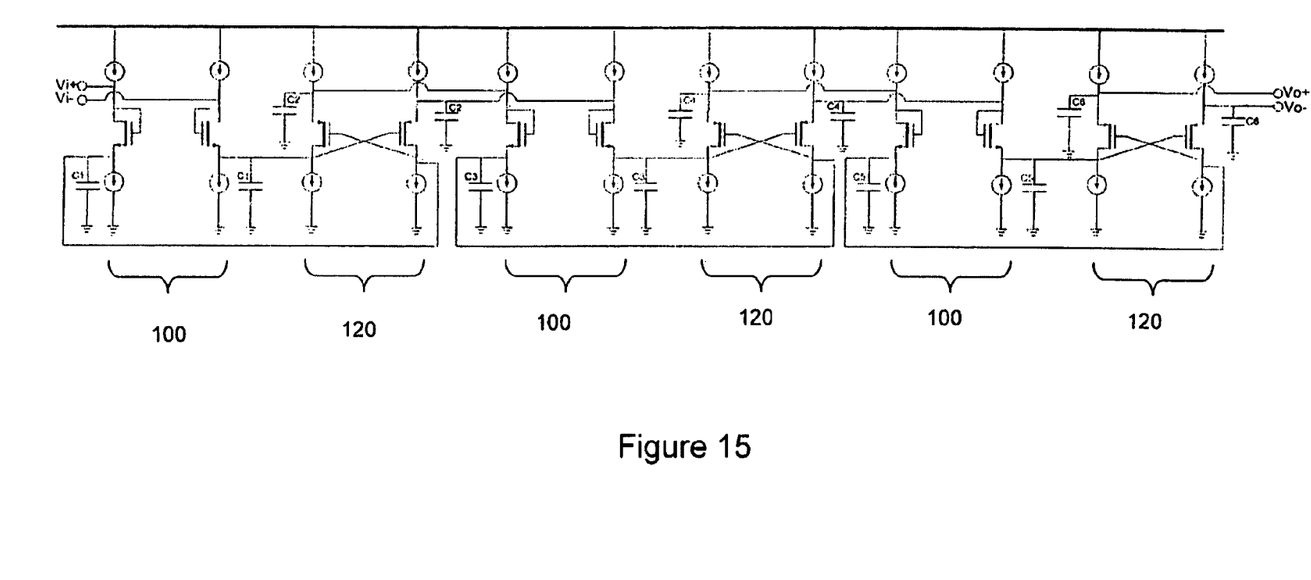
FIG. 15 is a circuit diagram of a sixth order filter of an embodiment of the invention.

An example sixth order filter is shown in FIG. 15. Here it will be seen that six first order filter stages are provided, being three of two different types, connected alternately. More particularly, the input filter stage corresponds to the NMOS positive source follower cell 100, of FIG. 10. The second stage corresponds to the PMOS negative source follower cell 120 of FIG. 12. The NMOS positive source follower cell, and the PMOS negative source follower cells are then alternated for the remaining four cells, as shown. In this way, a sixth order filter can be built up.

Of course, in other embodiments then a higher or lower order filter can be obtained, subject to the requirements set out previously, i.e. that at least one negative source follower cell should be included, and that preferably as many negative source follower cells are used as positive source follower cells (for an even order filter), and more preferably that negative and positive cells are alternated. Even more preferably, preferably each alternating cell is of an NMOS type followed by a PMOS type, respectively. This ensures that the DC level is maintained.

FIGS. 16 to 19 illustrate various performance characteristics of the sixth order low pass filter of FIG. 15, when implemented in 0.13 µm CMOS technology with a 1.2 volt supply. The prototype respects the requirements of a low pass filter embedded in an ultra wide band receiver path.

Figure 16:
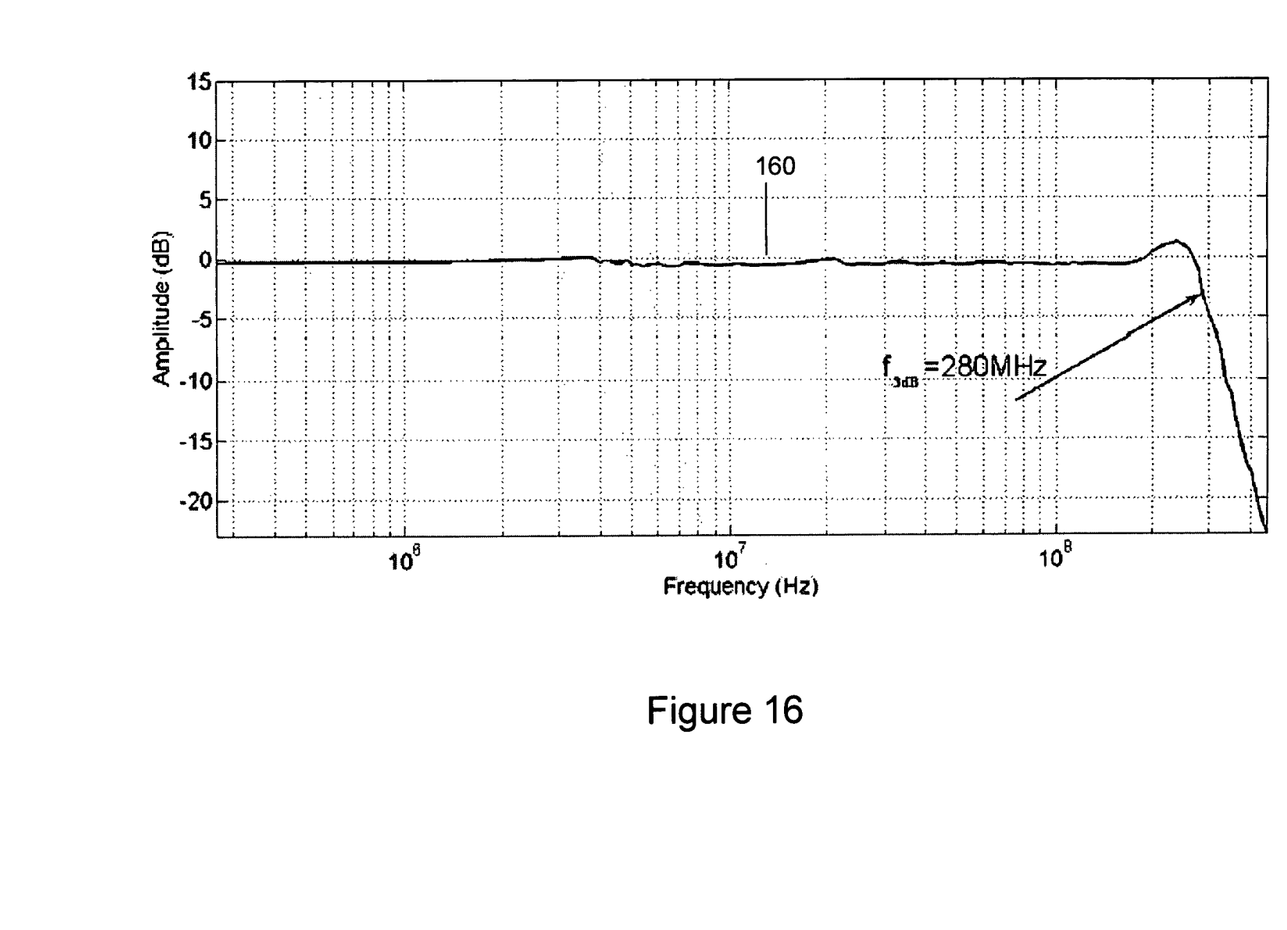
FIG. 16 is a graph of the filter frequency response of the sixth order filter of FIG. 15.
Figure 17:
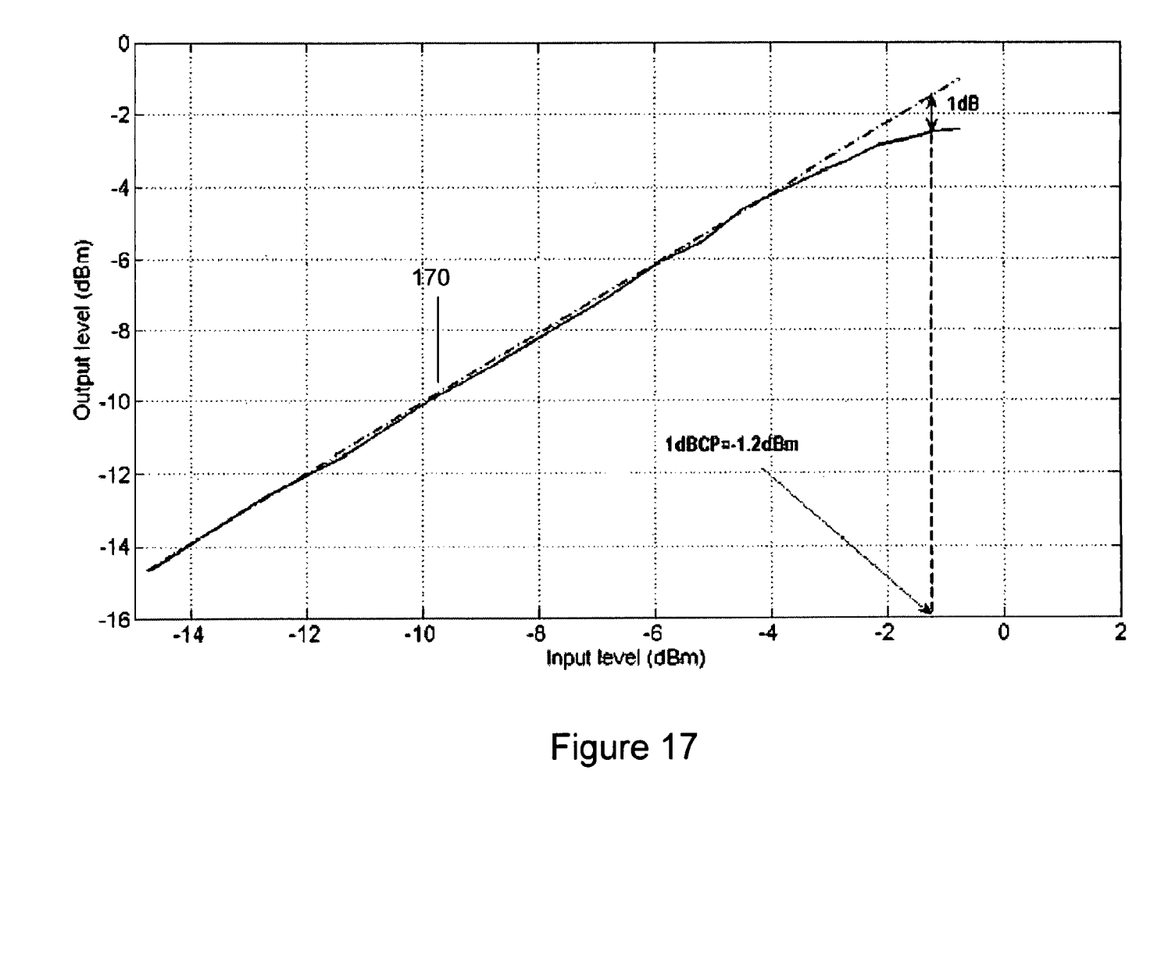
FIG. 17 is a graph of the output level vs. the input level of the sixth order filter of FIG. 15.
Figure 18:
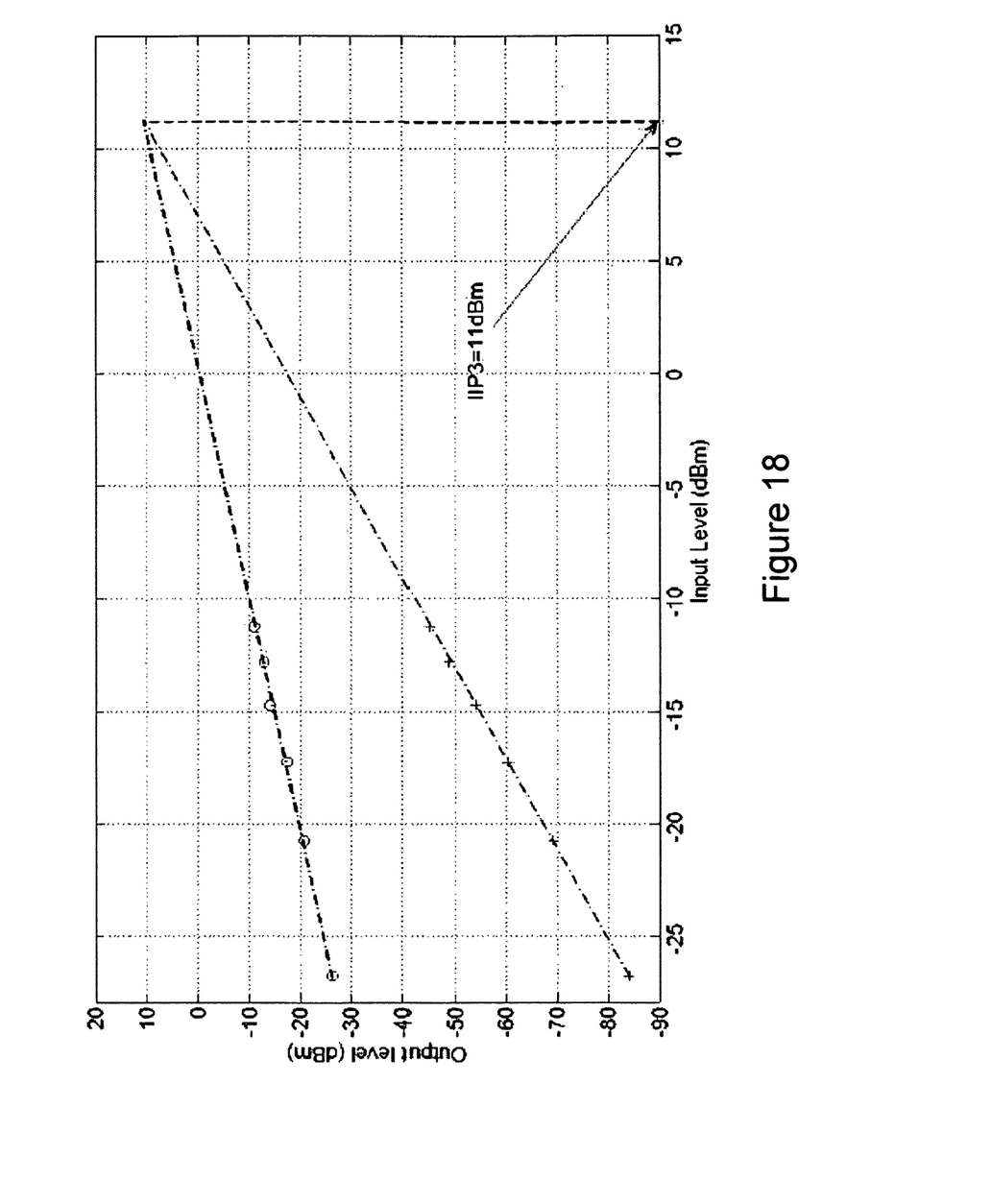
FIG. 18 is a graph of the output level vs. the input level of the sixth order filter of FIG. 15.
Figure 19:
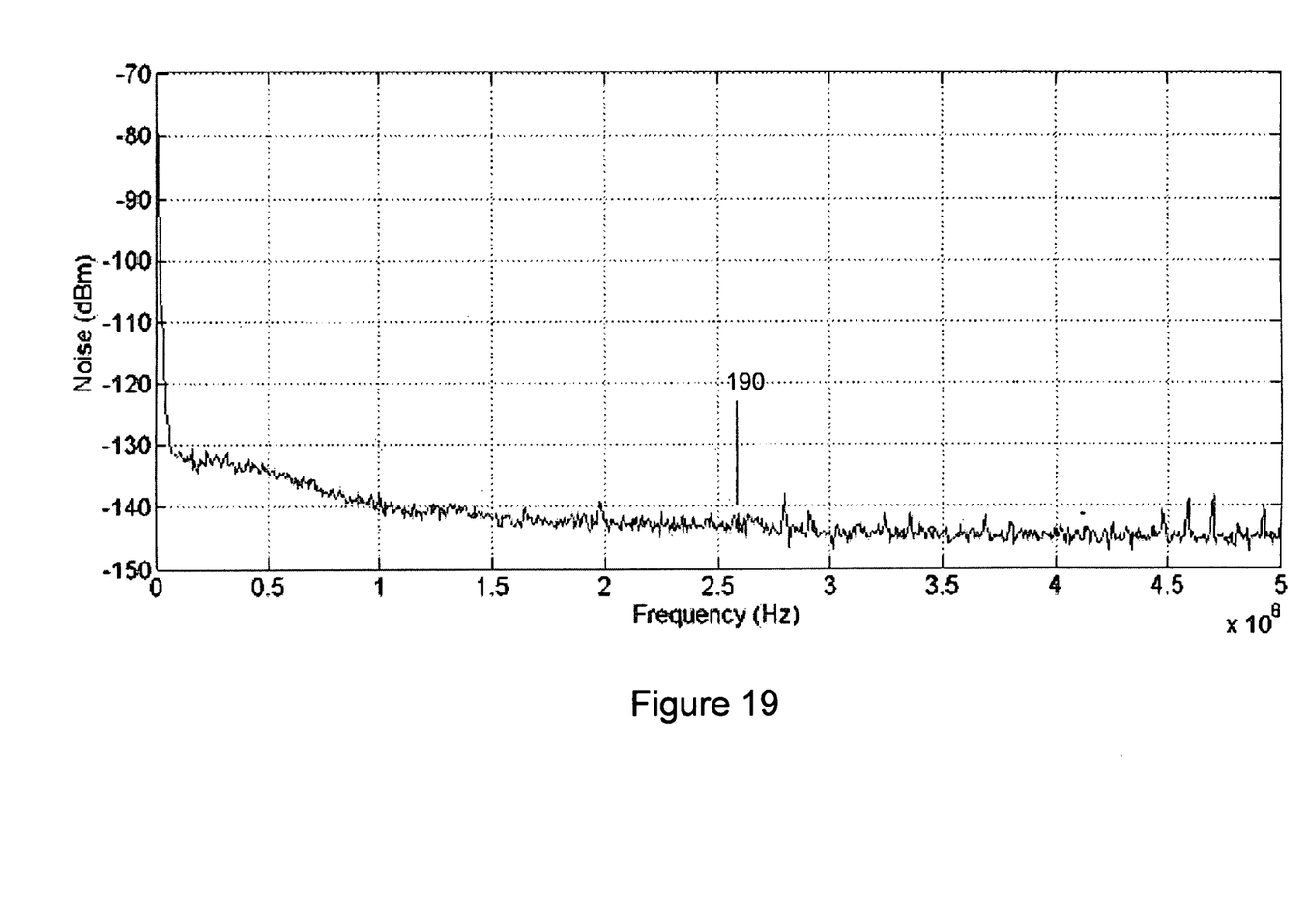
FIG. 19 is a graph of the input referred noise vs. frequency of the sixth order filter of FIG. 15.

FIG. 16 illustrates the filter transfer function. The cut off frequency is 280 MHz, while the DC gain is about 0 dB. Linearity has been evaluated in terms of 1 dBcp, and IIP3 as shown in FIGS. 17 and 18. A −1.2 dBm 1 dBcp and an 11 dBm IIP3 have been measured. FIG. 19 shows the output noise. The output noise is about −140 dBm at 3 MHz. Therefore, as will be seen the filter characteristics are extremely favourable, with a stable frequency response across the frequency range of interest, low noise, and low power consumption.

Various modifications may be apparent to the person skilled in the art to the above described embodiments, to provide further embodiments which obtain the advantages of the described embodiments of the present invention, and which are intended to be encompassed by the scope of the appended claims.

The invention claimed is:

1. A continuous time filter of at least a second (or higher) order, comprising:
    one or more first order filter stages of a first type, each first order filter stage of the first type comprising a reactive component and an impedance of a first type, the impedance of the first type being such that a first current therethrough is dependent on the difference between the input and output voltages of the filter stage;
    at least one first order filter stage of a second type, each first order filter stage of the second type comprising a reactive component and an impedance of a second type, the impedance of the second type being such that a second current therethrough is dependent on the sum of the input and output voltages of the filter stage, the impedance of the second type being realized by arranging a pair of transistors in cross-diode connection;
    wherein a transfer function of the continuous time filter is obtained comprising complex poles.

2. The filter according to claim 1, further comprising:
    a plurality of filter stages of the first type, wherein the number of filter stages of both the first and second types is indicative of the order of the filter.

3. The filter according to claim 1, further comprising:
    a plurality of filter stages of the second type, wherein the number of filter stages of both the first and second types is indicative of the order of the filter.

4. The filter according to claim 3, wherein, for an even order filter of order n there are n/2 filter stages of each of the first type and of the second type, and for an odd ordered filter there are (n−1)/2 filter stages of one of the first type or the second type, and (n+1)/2 filters stages of the other of the first type or the second type.

5. The filter according to claim 4, wherein the filter stages of the first type and the second type alternate in series, such that, for all stages other than a last stage, the output of a filter stage of one of the first or second types is connected to the input of a filter stage of the other of the first type or the second type.

6. The filter according to claim 1, wherein the filter stage of the first type comprises:
   a pair of transistors arranged to provide a differential input and output, the impedance of the filter stage of the first type being realized by arranging the transistors in a self-diode connection.

7. The filter according to claim 6, wherein the transistors are MOSFETs.

8. The filter according to claim 7, wherein the self-diode connection is provided by connecting a drain to a gate of each respective transistor in the filter stage of the first type.

9. The filter according to claim 1, wherein the transistors are MOSFETs.

10. The filter according to claim 9, wherein the cross-diode connection is provided by connecting a drain of one of a pair of transistors to a gate of the other transistor of the pair, and vice versa.

11. The filter according to claim 1, wherein respective sequential filter stages alternate between comprising n-channel or p-channel transistors, whereby the DC level may be substantially maintained.

12. The filter according to claim 1 further comprising:
   an ideal source-follower input stage, comprising a pair of transistors arranged to provide a differential input and output; and
   at least one reactive component.

13. The filter according to claim 12, wherein the ideal source follower input stage comprises one of n-channel or p-channel transistors, and wherein the next stage in the filter comprises transistors of the opposite type.

14. A continuous time filter of at least a second (or higher) order, comprising:
   one or more first order filter stages of a first type, each first order filter stage of the first type comprising a differential input and output, a reactive component and an impedance of a first type, the impedance of the first type being such that a first current therethrough is dependent on the difference between the input and output voltages of the filter stage;
   at least one first order filter stage of a second type, each first order filter stage of the second type comprising a differential input and output, a reactive component and an impedance of a second type, the impedance of the second type being such that a second current therethrough is dependent on the sum of the input and output voltages of the filter stage, the impedance of the second type being realized by arranging the second pair of transistors in cross-diode connection;
   wherein the differential inputs and outputs of the filter stages of the first and second types respectively comprise positive and negative inputs and positive and negative outputs, the filter stages of the first and second types being configured in a sequential ladder configuration such that the positive output node of one of the stages of the first or second types is arranged to provide a signal to the positive input node of a succeeding stage of the first or second types, and the negative output node of the one of the stages of the first or second types is arranged to provide a signal to the negative input node of the succeeding stage of the first and second types, wherein a transfer function of the continuous time filter is obtained comprising complex poles.

* * * * *